US011984146B2

(12) United States Patent
Baek

(10) Patent No.: US 11,984,146 B2
(45) Date of Patent: May 14, 2024

(54) NEUROMORPHIC DEVICE

(71) Applicant: KOREA INSTITUTE OF SCIENCE AND TECHNOLOGY, Seoul (KR)

(72) Inventor: Seung Heon Baek, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 112 days.

(21) Appl. No.: 17/721,747

(22) Filed: Apr. 15, 2022

(65) Prior Publication Data
US 2023/0154516 A1    May 18, 2023

(51) Int. Cl.
*G11C 11/16*    (2006.01)
*G11C 11/54*    (2006.01)

(52) U.S. Cl.
CPC ...... *G11C 11/1673* (2013.01); *G11C 11/1655* (2013.01); *G11C 11/1657* (2013.01); *G11C 11/1675* (2013.01); *G11C 11/54* (2013.01)

(58) Field of Classification Search
CPC ............................. G11C 11/1673; G11C 11/16
USPC ......................................................... 365/209
See application file for complete search history.

(56) References Cited

U.S. PATENT DOCUMENTS

| 2019/0272870 A1* | 9/2019 | Choi | G11C 11/54 |
| 2022/0359617 A1* | 11/2022 | Woo | H10N 50/85 |
| 2023/0013081 A1* | 1/2023 | Ma | G06N 3/065 |
| 2023/0065198 A1* | 3/2023 | Young | G11C 11/1675 |

* cited by examiner

*Primary Examiner* — Muna A Techane
(74) *Attorney, Agent, or Firm* — MARSHALL, GERSTEIN & BORUN LLP

(57) ABSTRACT

A neuromorphic device including: a plurality of unit weighting elements connected to a bit line in a manner that shares the bit line, each of the plurality of unit weighting elements being connected to a source line and comprising a fixed layer of which a magnetization direction is fixed, a free layer of which a magnetization direction changes in parallel with or in anti-parallel with the fixed layer, and a tunnel barrier layer arranged between the fixed layer and the free layer and a plurality of drive transistors being selectively turned on according to a plurality of bit selection signals, respectively, and correspondingly driving the unit weighting elements, respectively, wherein the plurality of unit weighting elements have different resistances in such a manner as to correspond to bits, respectively, of a synapse weight.

12 Claims, 8 Drawing Sheets

| RT1 | RT2 | RT3 | RT4 | 112a | 112b | 112c | 112d | 112a | 112b | 112c | 112d |
|---|---|---|---|---|---|---|---|---|---|---|---|
| ON | OFF | OFF | OFF | P | AP | AP | AP | 1 | 0 | 0 | 0 |
| OFF | ON | OFF | OFF | AP | P | AP | AP | 0 | 1 | 0 | 0 |
| OFF | OFF | ON | OFF | AP | AP | P | AP | 0 | 0 | 1 | 0 |
| OFF | OFF | OFF | ON | AP | AP | AP | P | 0 | 0 | 0 | 1 |
| ON | ON | OFF | OFF | P | P | AP | AP | 1 | 1 | 0 | 0 |
| ON | OFF | ON | OFF | P | AP | P | AP | 1 | 0 | 1 | 0 |
| ON | OFF | OFF | ON | P | AP | AP | P | 1 | 0 | 0 | 1 |
| OFF | ON | ON | OFF | AP | P | P | AP | 0 | 1 | 1 | 0 |
| OFF | ON | OFF | ON | AP | P | AP | P | 0 | 1 | 0 | 1 |
| OFF | OFF | ON | ON | AP | AP | P | P | 0 | 0 | 1 | 1 |
| ON | ON | ON | OFF | P | P | P | AP | 1 | 1 | 1 | 0 |
| ON | ON | OFF | ON | P | P | AP | P | 1 | 1 | 0 | 1 |
| ON | OFF | ON | ON | P | AP | P | P | 1 | 0 | 1 | 1 |
| OFF | ON | ON | ON | AP | P | P | P | 0 | 1 | 1 | 1 |
| ON | ON | ON | ON | P | P | P | P | 1 | 1 | 1 | 1 |
| OFF | OFF | OFF | OFF | AP | AP | AP | AP | 0 | 0 | 0 | 0 |

FIG. 5

| 112a | 112b | 112c | 112d | 112a | 112b | 112c | 112d | TOTAL OF AMOUNTS OF CURRENT |
|---|---|---|---|---|---|---|---|---|
| AP | AP | AP | AP | 0 | 0 | 0 | 0 | $\dfrac{15 + 0 \times TMR}{8R \times (1 + TMR)}$ |
| AP | AP | AP | P | 0 | 0 | 0 | 1 | $\dfrac{15 + 1 \times TMR}{8R \times (1 + TMR)}$ |
| AP | AP | P | AP | 0 | 0 | 1 | 0 | $\dfrac{15 + 2 \times TMR}{8R \times (1 + TMR)}$ |
| AP | AP | P | P | 0 | 0 | 1 | 1 | $\dfrac{15 + 3 \times TMR}{8R \times (1 + TMR)}$ |
| AP | P | AP | AP | 0 | 1 | 0 | 0 | $\dfrac{15 + 4 \times TMR}{8R \times (1 + TMR)}$ |
| AP | P | AP | P | 0 | 1 | 0 | 1 | $\dfrac{15 + 5 \times TMR}{8R \times (1 + TMR)}$ |
| AP | P | P | AP | 0 | 1 | 1 | 0 | $\dfrac{15 + 6 \times TMR}{8R \times (1 + TMR)}$ |
| AP | P | P | P | 0 | 1 | 1 | 1 | $\dfrac{15 + 7 \times TMR}{8R \times (1 + TMR)}$ |
| P | AP | AP | AP | 1 | 0 | 0 | 0 | $\dfrac{15 + 8 \times TMR}{8R \times (1 + TMR)}$ |
| P | AP | AP | P | 1 | 0 | 0 | 1 | $\dfrac{15 + 9 \times TMR}{8R \times (1 + TMR)}$ |
| P | AP | P | AP | 1 | 0 | 1 | 0 | $\dfrac{15 + 10 \times TMR}{8R \times (1 + TMR)}$ |
| P | AP | P | P | 1 | 0 | 1 | 1 | $\dfrac{15 + 11 \times TMR}{8R \times (1 + TMR)}$ |
| P | P | AP | AP | 1 | 1 | 0 | 0 | $\dfrac{15 + 12 \times TMR}{8R \times (1 + TMR)}$ |
| P | P | AP | P | 1 | 1 | 0 | 1 | $\dfrac{15 + 13 \times TMR}{8R \times (1 + TMR)}$ |
| P | P | P | AP | 1 | 1 | 1 | 0 | $\dfrac{15 + 14 \times TMR}{8R \times (1 + TMR)}$ |
| P | P | P | P | 1 | 1 | 1 | 1 | $\dfrac{15 + 15 \times TMR}{8R \times (1 + TMR)}$ |

NEUROMORPHIC DEVICE

STATEMENT OF GOVERNMENTAL SUPPORT

This invention was made with government support under Korea Institute of Science and Technology (KIST) institutional program (2E31541; contribution ratio of 1/2) and the National Research Foundation of Korea (NRF) program (2020M3F3A2A01081635; contribution ratio of 1/2) funded by Ministry of Science and ICT. The supervising institute was KOREA INSTITUTE OF SCIENCE AND TECHNOLOGY.

CROSS REFERENCE TO RELATED APPLICATION

The present application claims priority to Korean Patent Application No. 10-2021-0158200, filed Nov. 17, 2021, the entire contents of which is incorporated herein for all purposes by this reference.

BACKGROUND OF THE INVENTION

Field of the Invention

The present disclosure relates to a neuromorphic device and, more particularly to, a neuromorphic device capable of storing data by selecting each bit of a synapse and of reading out multi-level data simultaneously.

Description of the Related Art

In recent years, semiconductor elements in various forms have been under development in order to overcome limitations of computers based on the Von Neumann architecture. In the Von Neumann architecture, computing operations are performed by a fast-operating central processing unit (CPU). The CPU, usually referred to as a processor for short, is currently used as a device essential for the Von Neumann architecture. When the CPU processes a lot of data such as during big data analysis or in an artificial intelligence system, much time and energy are consumed for data fetching between a memory and the processor, thereby decreasing overall system performance.

Accordingly, methods of decreasing the time taken for the data fetching between the memory and the processor using a hardware accelerator, such as a graphics processing unit (GPU) or a tensor processing unit (TPU), have been developed. The GPU, the TPU, and the like are CMOS-based auxiliary processors and are specialized for parallel arithmetic processing. The hardware accelerator can be arranged adjacent to the memory to reduce the time taken for the data fetching. However, the data fetching is ultimately necessary. Thus, there is a limitation of the hardware accelerator in overcoming a decrease in system performance.

Brain-inspired semiconductor elements have been under development to overcome the limitation. The brain-inspired semiconductor element performs computing operations using digital/analog elements imitating neurons and synapses in the human brain. The brain-inspired semiconductor element employs a computing method typical of the non-Von Neumann architecture. The brain-inspired semiconductor element can greatly decrease energy consumption and at the same time is capable of performing a wide range of processing, such as recognition, learning, and decision making. Currently, as the brain-inspired semiconductor element, a processing-in-memory (PIM) element that serves to perform both a memory function and a processor function of performing an arithmetic operation is widely used.

A primary function of a neuron is to generate electrical spikes and transmit information to another neuron when receiving stimuli at or above a threshold. An electrical signal generated in this manner is called action potential. A neuron is broadly divided into three regions, that is, a soma, a dendrite, and an axon. The soma has a nucleus, the dendrite receives signals from other neurons, and the axon carries signals to other neurons. A synapse serving to transfer the signal is present between the dendrite and the axon.

The synapse has a weighting value and indicates the degree of connection between neurons. A signal can be further amplified or suppressed according to the weighting value. That is, the synapse serves to store information according to its weight and at the same time to process a signal. A memory is necessary to store the weighting value of the synapse.

In recent years, a next-generation memory device, such as Resistive Random Access Memory (RRAM), Magnetic Random Access Memory (MRAM), or Phase Change Memory (PCM), has been realized as a cross-point array, and thus methods of storing the weighting value of the synapse have been under development. The cross-point array is configured to include a plurality of input terminals and a plurality of output terminals, and has a structure in which a unit cell is positioned at points where the input terminals intersect the output terminals, respectively. The cross-point array is capable of performing an arithmetic operation. A memory in the cross-point array occupies a small area. The cross point array has the advantage of achieving low power consumption.

An ideal synapse for imitating the human brain needs to experience an analogic weight change in a linear manner. Currently, a digital device uses the binary notation of 0's and 1's. Thus, there is a limitation in expressing an analogic weight varying between 0 and 1. Therefore, in order to cause the analogic weight change, there is a need to develop a device having multi-level characteristics and being capable of storing a plurality of levels.

The foregoing is intended merely to aid in the understanding of the background of the present disclosure, and is not intended to mean that the present disclosure falls within the purview of the related art that is already known to those skilled in the art.

SUMMARY OF THE INVENTION

An objective of the present disclosure is to provide a neuromorphic device capable of storing data by selecting each bit of a synapse and of reading out multi-level data simultaneously.

According to an aspect of the present disclosure, there is provided a neuromorphic device including: a plurality of unit weighting elements connected to a bit line in a manner that shares the bit line, each of the plurality of unit weighting elements being connected to a source line and including a fixed layer of which a magnetization direction is fixed, a free layer of which a magnetization direction changes in parallel with or in anti-parallel with the fixed layer, and a tunnel barrier layer arranged between the fixed layer and the free layer; and a plurality of drive transistors being selectively turned on according to a plurality of bit selection signals, respectively, and correspondingly driving the unit weighting elements, respectively, wherein the plurality of unit weighting elements have different resistances in such a manner as to correspond to bits, respectively, of a synapse weight.

In the neuromorphic device, a resistance ratio between the plurality of unit weighting elements may be set to $2^n$ times.

In the neuromorphic device, each of the plurality of unit weighting elements may vary in area with the resistance value.

In the neuromorphic device, the tunnel barrier layer of each of the plurality of unit weighting elements may vary in thickness with the resistance value.

In the neuromorphic device, among the plurality of unit weighting elements, the unit weighting element having the lowest resistance value may correspond to the most significant bit of the synapse weight, and the unit weighting element having the highest resistance value may correspond to the most insignificant bit of the synapse weight.

In the neuromorphic device, each of the plurality of drive transistors may be connected between each of the plurality of unit weighting elements and the source line, and gate terminals of the plurality of drive transistors may be connected to a plurality of word lines, respectively.

In the neuromorphic device, in a state where among the plurality of drive transistors, the corresponding drive transistor is turned on according to the bit selection signal, the magnetization direction of the free layer of each of the plurality of unit weighting elements may be controlled with write current flowing through between the bit line and the source line, and thus the synapse weight may be stored.

In the neuromorphic device, in a state where the plurality of drive transistors are turned on and where a write control voltage having the same magnitude is applied between the free layer and the fixed layer, the synapse weight may be read out with a total of amounts of current flowing between the free layer and the fixed layer of each of the plurality of unit weighting elements.

In the neuromorphic device, each of the plurality of unit weighting elements may further include an electrode layer through which spin-orbit torque is applied to the free layer, and a first terminal of the electrode layer may be connected to the bit line, and a second terminal thereof may be connected to the source line.

In the neuromorphic device, each of the plurality of drive transistors may be connected between the bit line and the first terminal of the electrode layer, and gate terminals of the plurality of drive transistors may be connected to a plurality of word lines, respectively.

In the neuromorphic device, in a state where among the plurality of drive transistors, the corresponding drive transistor is turned on according to the bit selection signal, the magnetization direction of the free layer of each of the plurality of unit weighting elements may be controlled with write current flowing through between the bit line and the source line, and thus the synapse weight may be stored.

The neuromorphic device may further include a common drive transistor connected between the bit line and each of the plurality of unit weighting elements in a shared manner, and selectively turned on according to a read drive signal.

In the neuromorphic device, in a state where the common drive transistor is turned on, the synapse weight may be read out with a total of amounts of current flowing between the free layer and the fixed layer of each of the plurality of unit weighting elements.

The disclosed technology has the following effect. In addition, a specific implementation example of the neuromorphic device is not meant to be acquired to achieve all the following effects or only the following effects and therefore should not be understood as imposing any limitation on the claimed scope of the present disclosure.

The neuromorphic device according to the embodiment of the present disclosure can store data by selecting each bit of the synapse weight and can read out multi-level data simultaneously.

BRIEF DESCRIPTION OF THE DRAWINGS

The above and other objectives, features, and other advantages of the present disclosure will be more clearly understood from the following detailed description when taken in conjunction with the accompanying drawings, in which:

FIGS. 3A and 3B are diagrams necessary to describe write operation of each of the first to fourth unit weighting elements illustrated in FIG. 1;

FIGS. 4 and 5 are diagrams necessary to describe read operation of each of the first to fourth unit weighting elements 112a to 112d illustrated in FIG. 1;

DETAILED DESCRIPTION OF THE INVENTION

Figure 1:
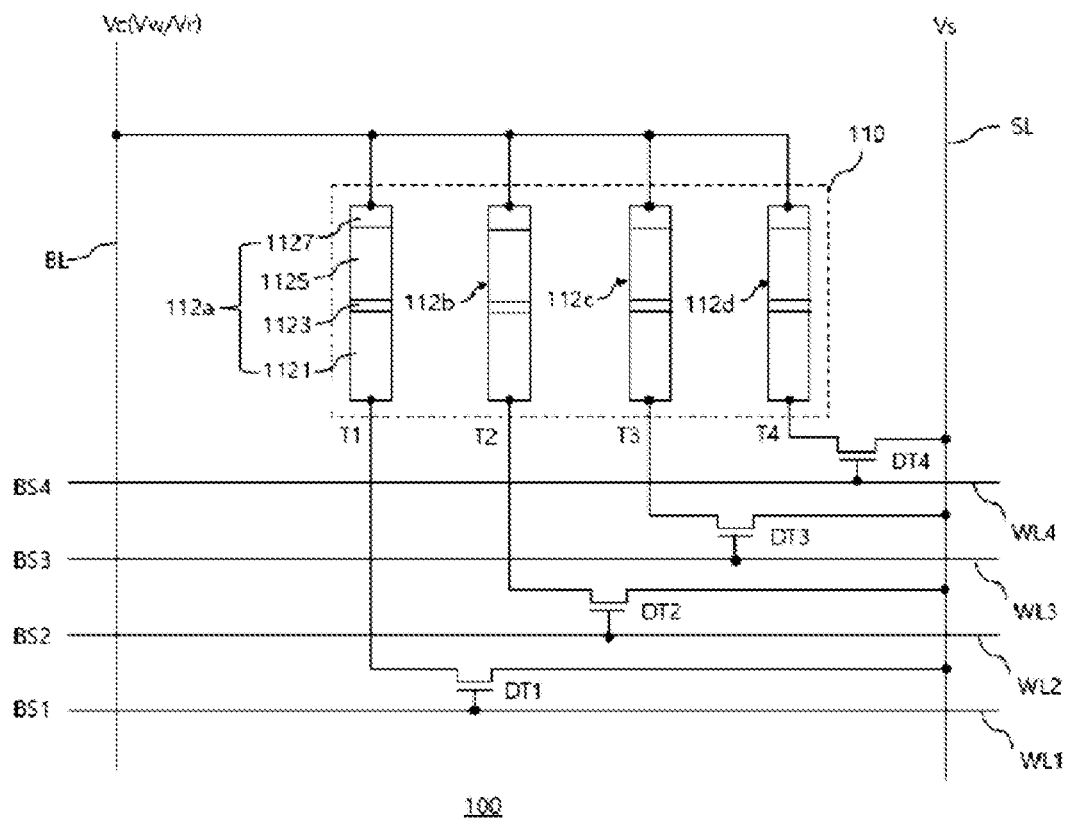
FIG. 1 is a diagram illustrating a neuromorphic device according to a first embodiment of the present disclosure.

An embodiment of the present disclosure will be described below in an exemplary manner in terms of structures and functions. Therefore, the claimed scope of the present disclosure should not be construed as being limited by the embodiment of the present disclosure. That is, various modifications can be made to the embodiment, and the embodiment can take various forms. Therefore, equivalents of the embodiment that can realize the technical idea of the present disclosure should be understood as falling within the scope of the present disclosure. In addition, a specific embodiment is not meant to be required to achieve all the objectives of the present disclosure or all the effects thereof or to achieve only all the effects, and therefore should not be understood as imposing any limitation on the claimed scope of the present disclosure.

The terms used through the present application should be understood as having the following meanings.

The terms "first", "second", and so on are intended to distinguish among constituent elements and therefore should not be construed as imposing any limitation on the claimed scope of the present disclosure. For example, a first constituent element may be named a second constituent element. In the same manner, the second constituent element may also be named the first constituent element.

A constituent element, when described as being "connected to" a different constituent element, should be understood as being connected directly to the different constituent element or as being connected to the different constituent element with a third intervening constituent element interposed therebetween. By contrast, a constituent element, when described as being "connected directly to" a different constituent element, should be understood as being connected to the different constituent element without any third intervening constituent element interposed therebetween. Expressions such as "between" and "directly between" and expressions such as "adjacent to" and "directly adjacent to" that are used to describe a relationship between constituent elements should also be construed in the same manner.

The term used in the present specification, although expressed in the singular, is construed to have a plural meaning, unless otherwise explicitly meant in context. It should be understood that the terms "include", "have", and the like are intended to indicate that a feature, a number, a step, an operation, a constituent element, a component, or any combination thereof is present, without precluding the possible presence or addition of one or more other features, numbers, steps, operations, constituent elements, or any combination thereof.

Identification characters (for example, a, b, c, and so forth) are assigned to steps for convenience of description. The identification characters do not indicate the order of steps. Unless otherwise stated in context, steps may be performed in a different order than mentioned. That is, steps may be performed in the mentioned order. Steps may be performed substantially at the same time and may be performed in reverse order.

Unless otherwise defined, each of all terms used throughout the present specification has the same meaning as is normally understood by a person of ordinary skill in the art to which the present disclosure pertains. A term as defined in a commonly used dictionary should be construed as having the same meaning as that in context in the related art and, unless otherwise explicitly defined in the present application, should not be construed as having an excessively implied meaning or a purely literal meaning.

FIG. 1 is a diagram illustrating a neuromorphic device according to a first embodiment of the present disclosure.

With reference to FIG. 1, a neuromorphic device 100 according to the first embodiment of the present disclosure may include a bit line BL, first to fourth word lines WL1 to WL4, a source line SL, a synapse weighting element 110, and first to fourth drive transistors DT1 to DT4. In this case, the bit line BL may be arranged in a manner that intersects each of the first to fourth read word lines WL1 to WL4, and the source line SL may be arranged in parallel with the bit line BL.

The synapse weighting element 110 may store data on the basis of each bit of a synapse weight. The synapse weighting element 110 may include first to fourth unit weighting elements 112a to 112d. Each of the first to fourth unit weighting elements 112a to 112d, as a magnetic tunnel junction structure, MTJ, corresponds to each bit of the synapse weight.

The first embodiment of the present disclosure is described, taking as an example a case where the synapse weight is four bits, but is not limited to four bits. In a case where the synapse weight is n-bit data, the synapse weighting element 110 may include n unit weighting elements.

The first to fourth unit weighting elements 112a to 112d are connected to the bit line BL in a manner that shares the bit line BL and are correspondingly connected to the source line SL through the first to fourth drive transistors DT1 to DT4, respectively. Each of the first to fourth unit weighting elements 112a to 112d may include a free layer 1121, a tunnel barrier layer 1123, a fixed layer 1125, and a capping layer 1127. The free layer 1121 is arranged on the top of the electrode 114 and changes in parallel with or in anti-parallel with a magnetization direction of the fixed layer 1125. The free layer 1121 may contain a ferromagnetic material, for example, any one material selected from the group consisting of Fe, Co, Ni, B, Si, Zr, Pt, Tb, Pd, Cu, W, Ta, and Mn.

The tunnel barrier layer 1123 is arranged on the top of the free layer 1121 and may serve as a tunnel barrier. The tunnel barrier layer 1123 may contain a non-magnetic material, for example, at least one material selected from the group consisting of MgO, MgAlO, MgTiO, $Al_2O_3$, $HfO_2$, $TiO_2$, $Y_2O_3$, and $Yb_2O_3$.

The fixed layer 1125 is arranged on the top of the tunnel barrier layer 1123, and magnetization thereof is directed toward a predetermined fixed direction. The fixed layer 1125 may contain a ferromagnetic material, for example, any one material selected from the group consisting of Fe, Co, Ni, B, Si, Zr, Pt, Tb, Pd, Cu, W, and Ta.

The capping layer 1127 is arranged on the top of the fixed layer 1125 and may serve to prevent the fixed layer 1125 from being oxidized. The capping layer 1127 may be formed as an oxide film. The capping layer 1127 here may contain a metal material. For example, the capping layer 1127 may contain Ta, Ru, W, Mo, Co, Fe, Ni, TiN, CoFe, FeNi, CoNi, CoFeB, CoFeBMo, CoFeBW, or the like.

The first to fourth unit weighting elements 112a to 112d according to the first embodiment may have different resistance values. A resistance ratio between the first to forth unit weighting elements 112a to 112d may be set to $2^n$ times. For example, the resistance ratio among the respective resistance values of the first to fourth unit weighting elements 112a to 112d may be set to $1(=2^0):2(=2^1):4(=2^2):8(=2^3)$. A method of differently setting the respective resistance values of the first to fourth unit weighting elements 112a to 112d is described in detail with reference to FIGS. 2A and 2B.

Among the first to fourth unit weighting elements 112a to 112d, the unit weighting element having the lowest resistance value corresponds to the most significant bit of the synapse weight, and the unit weighting element having the highest resistance value corresponds to the most insignificant bit of the synapse weight. The first embodiment of the present disclosure is described, taking as an example a case where, among the first to fourth unit weighting elements 112a to 112d, the first unit weighting element 112a corresponds to the most significant bit of the synapse weight and where the fourth unit weighting element 112d corresponds to the most insignificant bit of the synapse weight.

The first drive transistor DT1 may be connected between the first unit weighting element 112a and the source line SL. The second drive transistor DT2 may be connected between the second unit weighting elements 112b and the source line SL. The third drive transistor DT3 may be connected between the third unit weighting element 112c and the source line SL. The fourth drive transistor DT4 may be connected between the fourth unit weighting element 112d and the source line SL. Gates terminals of the first to fourth drive transistors DT1 to DT4 may be connected to the first to fourth word lines WL1 to WL4, respectively. The first to fourth drive transistors DT1 to DT4 may be formed as NMOS transistors, respectively, and may be selectively turned on according to first to fourth selection signal BS1 to BS4, respectively.

Figure 2A:
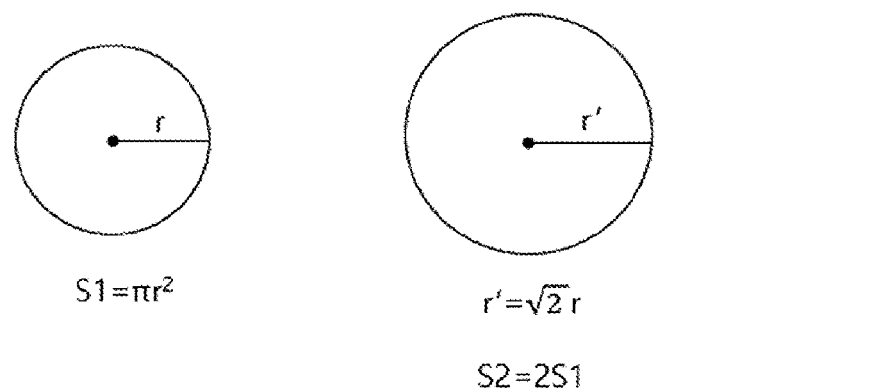
FIGS. 2A and 2B are diagrams necessary to describe a method of differently setting respective resistances of first to fourth unit weighting elements illustrated in FIG. 1.
Figure 2B:
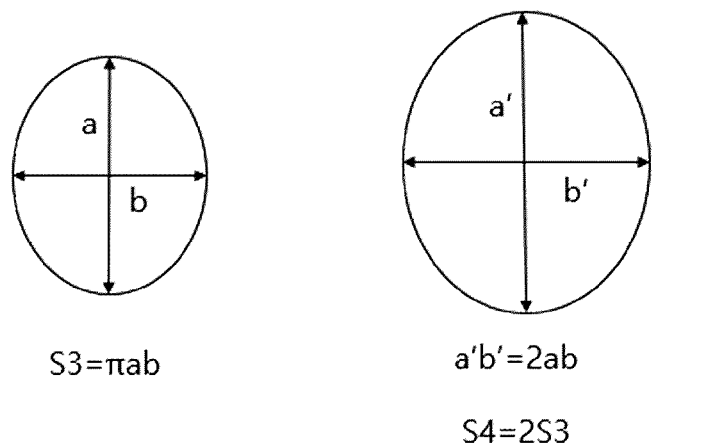

FIGS. 2A and 2B are diagrams necessary to describe a method of differently setting the respective resistances of first to fourth unit weighting elements illustrated in FIG. 1.

With reference to FIG. 2A, in a case where the first to fourth unit weighting elements 112a to 112d each have a circular cross-section, an area of the circular cross-section is in proportion to the square of the radius. The respective resistance values of the first to fourth unit weighting elements 112a to 112d each have to change by a factor of 2, and thus the areas thereof each have to change by a factor of 2. Therefore, when the radius changes by a factor of $\sqrt{2}$, the area changes by a factor of 2. For example, if it is assumed that a radius of the first unit weighting element 112a is r and that an area thereof is S1, when a radius of the second unit weighting element 112b changes from r' to $\sqrt{2}$r, an area S2 thereof increases to two times than the area S1.

By contrast, in a case where the first to fourth unit weighting elements 112a to 112d each have an elliptical cross-section, as illustrated in FIG. 2B, an area of the elliptical cross-section is in proportion to the product of a length of a long axis a and a length of a short axis b. Therefore, when the product of the length of the long axis a and the length of the short axis b increases two times, the resistance value increases two times. The more the areas of the first to fourth unit weighting elements 112a to 112d increase, the more the resistance values decrease. Therefore, among the first to fourth unit weighting elements 112a to 112d, the magnetic tunnel junction structure having the lowest resistance value may be formed in a manner that has the largest area, and the magnetic tunnel junction structure having the highest resistance value may be formed in a manner that has the smallest area. The advantage of this method is that a photolithography process can be performed only one time.

In addition to the method of changing the respective areas of the first to fourth unit weighting elements 112a to 112d, there is a method of changing the resistance value by differently changing the thickness of the tunnel barrier layer 1123. Usually, when the thickness of the tunnel barrier layer 1123 increases, a value of a resistance area (RA), that is, the product of the resistance and the area, exponentially increases. Conversely, when the thickness of the tunnel barrier layer 1123 decreases, the value of the RA exponentially decreases.

That is, the thickness of the tunnel barrier layer 1123 and the value of the RA have a predetermined relationship. Thus, the respective resistance values of the first to fourth unit weighting elements 112a to 112d can increase two times on the basis of this predetermined relationship. The advantage of this method is that the first to fourth unit weighting elements 112a to 112d can be realized in such a manner that the respective areas thereof are the same.

Figure 3A:
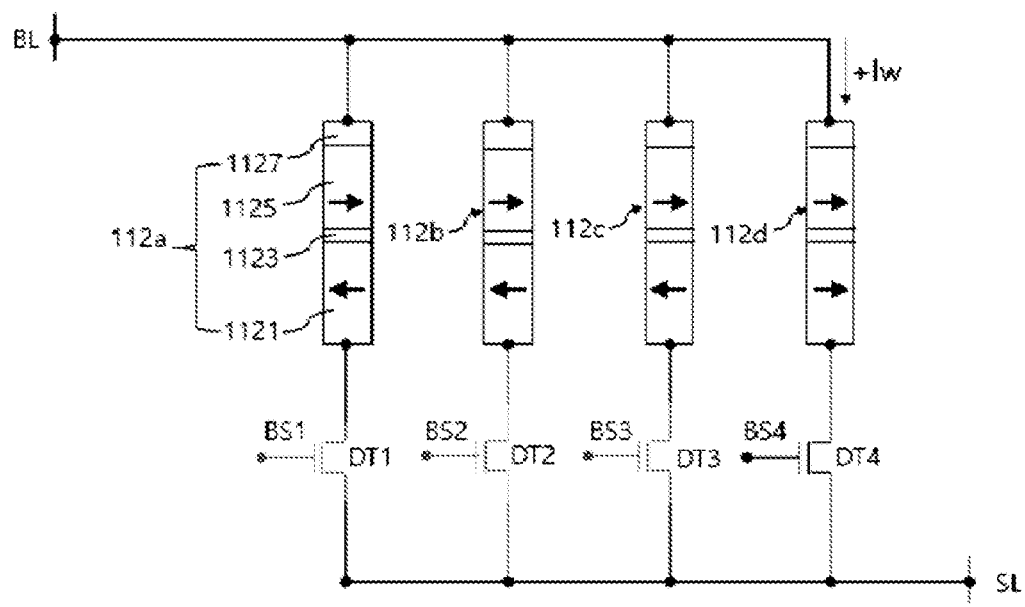

FIGS. 3A and 3B are diagrams necessary to describe write operation of each of the first to fourth unit weighting elements 112a to 112d illustrated in FIG. 1.

With respect to FIG. 3A, the first to fourth selection signals BS1 to BS4 at a high level that correspond to bits selected during the write operation are applied, and thus the first to fourth drive transistors DT1 to DT4, respectively, are correspondingly turned on. At this point, a write control voltage Vw is applied to the bit line BL. Then, through the corresponding drive transistor, write current Iw flows through opposite terminals of the corresponding unit weighting element among the first to fourth unit weighting elements 112a to 112d.

For example, when the fourth drive transistor DT4 is turned on, the write current Iw flows through opposite terminals of the fourth unit weighting element 112d. At this point, the free layer 1121 of the fourth unit weighting element 112d may switch to a state of being in parallel (P) with or in anti-parallel (AP) with the magnetization direction of the fixed layer 1125 according to a direction of the write current Iw.

For example, in a state where magnetization directions of the free layers 1121 of the first to fourth unit weighting elements 112a to 112d are all in anti-parallel with the magnetization direction of the fixed layers 1125, when positive (+) write current +Iw flows in a direction from the bit line BL to the source line SL, the free layer 1121 of the fourth unit weighting element 112d is magnetically inverted in parallel with the magnetization direction of the fixed layer 1125 (indicated by arrows).

The first to fourth unit weighting elements 112a to 112d, when the magnetization directions of the free layers 1121 and the fixed layers 1125 thereof are anti-parallel (AP), are in a high resistance state, and thus the lowest current flows. The first to fourth unit weighting elements 112a to 112d, when the magnetization directions of the free layers 1121 and the fixed layers 1125 thereof are parallel (P), are in a low resistance state, and thus the highest current flows.

Accordingly, for description of the first embodiment of the present disclosure, by definition, when the first to fourth unit weighting elements 112a to 112d each are in an anti-parallel state, a data of 0 is stored, and when the first to fourth unit weighting elements 112a to 112d each are in a parallel state, a data of 1 is stored. Therefore, when the free layer 1121 of the fourth unit weighting element 112d is magnetically inverted in parallel with the fixed layer 1125, the synapse weight may be stored as "0001".

In this manner, the first to fourth unit weighting elements 112a to 112d may be selected through the first to fourth drive transistors DT1 to DT4, respectively, and thus the synapse weight may be stored. Therefore, as illustrated in FIG. 3B, the synapse weight may be stored in such a manner as to have one of 16 levels ranging from "0000" to "1111", using the four drive transistor DT1 to DT4 and the four weighting elements 112a to 112d.

Figure 4:
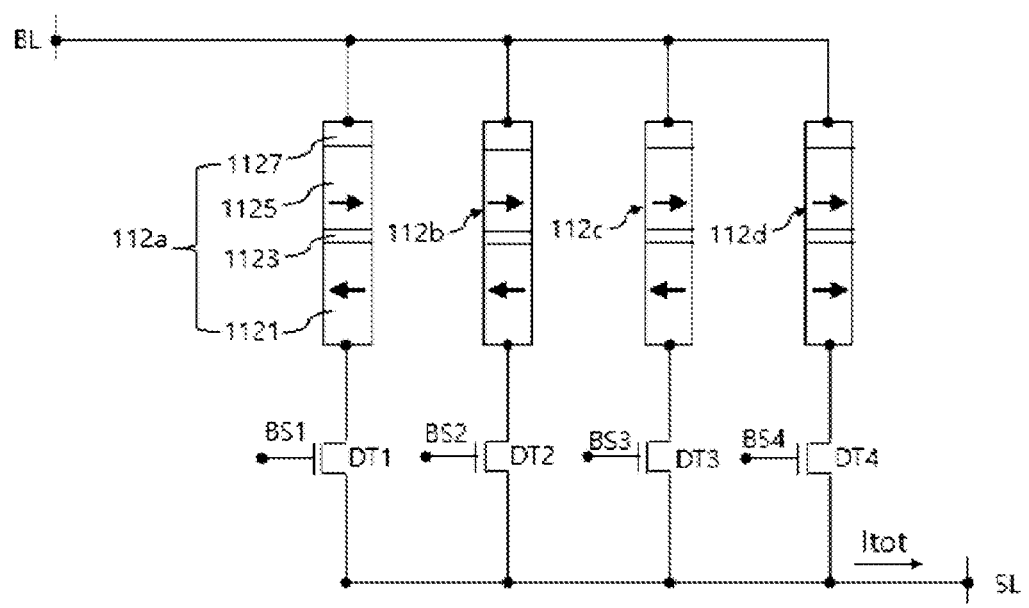

FIGS. 4 and 5 are diagrams necessary to describe read operation of each of the first to fourth unit weighting elements 112a to 112d illustrated in FIG. 1.

With reference to FIG. 4, during a read operation, the first to fourth selection signals BS1 to BS4 at a high level are applied, and thus the first to fourth drive transistors DT1 to DT4 are all turned on. Accordingly, the first to fourth unit weighting elements 112a to 112d are in parallel connected with each other between the bit line BL and the source line SL. At this point, when a read control voltage Vr is applied to the bit line BL, current corresponding to a read control voltage Vr flows through each of the first to fourth unit weighting elements 112a to 112d.

At this point, the first to fourth unit weighting elements 112a to 112d have different resistance values. Therefore, the following method is necessary to apply the read control voltage Vr having the same magnitude to opposite terminals of each of the first to fourth unit weighting elements 112a to 112d.

For example, in a case where first to fourth read drive transistors RT1 to RT4 are realized as the same types of transistors, respectively, voltages may be applied to gates, respectively, of the first to fourth read drive transistors RT1 to RT4 in such a manner that first to fourth bit selection signals SR1 to SR4 have different voltage levels.

Specifically, voltages may be applied in such a manner that the first to fourth selection signals BS1 to BS4 have different voltage levels according to the respective resistances of the first to fourth unit weighting elements 112a to 112d. In terms of a structural relationship, the first to fourth drive transistors DT1 to DT4 are connected in series to the corresponding first to fourth unit weighting elements 112a to 112d, respectively, between the bit line BL and the source line SL. Therefore, voltages between drain and source terminals of the first drive transistor DT1, between drain and source terminals of the second drive transistor DT2, between drain and source terminals of the third drive transistor DT3, and between drain and source terminals of the fourth drive transistor DT4 are distributed according to resistances, respectively, of the first to fourth unit weighting elements 112a to 112d.

The respective resistance values of the first to fourth drive transistors DT1 to DT4 change in a non-linear manner according to the voltages, respectively, that are applied to the respective gates thereof. For this reason, voltages of which the levels are lowered as the resistances of the first to fourth unit weighting elements 112a to 112d increases are applied to the gates of the corresponding first to fourth drive transistors DT1 to DT4, respectively, the same voltage may be applied to opposite terminals of each of the first to fourth unit weighting elements 112a to 112d during the read operation.

In addition to this method, the following method may be employed. The first to fourth drive transistors DT1 to DT4 may be manufactured in such a manner that sizes thereof are different from each other. Then, the same voltages may be applied to opposite terminals of each of the first to fourth unit weighting elements 112a to 112d. The greater an area of a MOSFET, the lower an ON resistance of the MOSFET. Therefore, the MOSFET may be manufactured in such a manner that the higher the resistance of each of the first to fourth unit weighting elements 112a to 112d, the lower a ratio of a width W of each of the corresponding first to fourth drive transistors DT1 to DT4 to a length L thereof, that is, a W-to-L ratio. Thus, the same voltages may be applied to the opposite terminals of each of the first to fourth unit weighting elements 112a to 112d.

In this manner, in a case where the read control voltage Vr having the same magnitude is applied to the opposite terminals of each of the first to fourth unit weighting elements 112a to 112d, current flowing through each of the first to fourth unit weighting elements 112a to 112d is measured.

In a case where instead of current, a resistance or a voltage is measured, the synapse weight is difficult to read out at equal intervals. That is, the resistances of the first to fourth unit weighting elements 112a to 112d are defined as Ra, Rb, Rc, and Rd, respectively, a total $R_{tot}$ of all the resistances is expressed as in following Equation 1.

$$\frac{1}{R_{tot}} = \frac{1}{R_a} + \frac{1}{R_b} + \frac{1}{R_c} + \frac{1}{R_d}$$ [Equation 1]

By contrast, current flowing through each of the first to fourth unit weighting elements 112a to 112d is in proportion to conductance, that is, 1/R. Therefore, a total $I_{tot}$ of amounts of current flowing through each of the first to fourth unit weighting elements 112a to 112d is expressed as in following Equation 2.

$$\frac{V_c}{R_{tot}} = \frac{V_c}{R_a} + \frac{V_c}{R_b} + \frac{V_c}{R_c} + \frac{V_c}{R_d}$$ [Equation 2]

$$I_{tot} = I_a + I_b + I_c + I_d$$

At this point, a tunnel magnetoresistance (TMR) of each of the first to fourth unit weighting elements 112a to 112d is expressed in following Equation 3.

$$TMR = \frac{R_{AP} - R_P}{R_P}$$ [Equation 3]

Where $R_{AP}$ is a resistance value that results when the magnetization direction is anti-parallel and $R_P$ is a resistance value that results when the magnetization direction is parallel. Therefore, a resistance value that results when the magnetization direction is anti-parallel is expressed as in following Equation 4.

$$R_{AP} = R_P \times (1 + TMR)$$ [Equation 4]

The first to fourth unit weighting elements 112a to 112d according to the first embodiment of the present disclosure has different resistance values. Therefore, the current flowing through each of the first to fourth unit weighting elements 112a to 112d along the magnetization direction is expressed in following Table 1.

TABLE 1

| Unit weighting element | Resistance Parallel (P) | Anti-parallel | Current |
|---|---|---|---|
| 112a | R | R × (1 + TMR) | $\frac{Vr}{R \times (1 + TMR)}$ |
| 112b | 2R | 2R × (1 + TMR) | $\frac{Vr}{2R \times (1 + TMR)}$ |
| 112c | 4R | 4R × (1 + TMR) | $\frac{Vr}{4R \times (1 + TMR)}$ |
| 112d | 8R | 8R × (1 + TMR) | $\frac{Vr}{8R \times (1 + TMR)}$ |

At this point, in a case where the synapse weight is expanded to n bits, that is, in a case where n unit weighting elements are provided, current flowing through each of the n unit weighting element is expressed in following Table 2.

TABLE 2

| Resistance Parallel (P) | Anti-parallel | Current |
|---|---|---|
| $2^{n-1}R$ | $2^{n-1} \times R \times (1 + TMR)$ | $\frac{Vr}{2^{n-1} \times R \times (1 + TMR)}$ |

Therefore, a total of amounts of current flowing through each of the first to fourth unit weighting elements 112a to 112d can be expressed according to the magnetization direction as in FIG. 5. That is, the total of amounts of current flowing through each of the first to fourth unit weighting elements 112a to 112d can be defined as in following Equation 5.

$$\frac{15 + (x) \times TMR}{8R \times (1 + TMR)}$$ [Equation 5]

Where x is a value that results from converting a binary number into a decimal number. For example, when the synapse weight is "0010", the decimal number of "0010" is 3. Therefore, x corresponds to 3. When the synapse weight is expanded to n bits, the total of amounts of current through each of n unit weighting elements is expressed as in following Equation 6.

$$\frac{(2^n - 1) + (x) \times TMR}{2^{n-1} \times R \times (1 + TMR)}$$ [Equation 6]

Therefore, when the synapse weight is read out using the total of amounts of current flowing through each of the first to fourth unit weighting elements 112a to 112d, the synapse weight can be read out at equal intervals. In addition, the synapse weight can be expressed in terms of $2^n$ levels arranging from 0 to $2^{n-1}$, and the synapse weights stored in the first to fourth unit weighting elements 112a to 112d, respectively, can be read out simultaneously. Thus, a complex circuit, such as a shift register for sequentially reading out data on a per-bit basis and combining the read out data into one word is unnecessarily, and the read operation can be performed.

In this manner, in the neuromorphic device 100 according to the first embodiment of the present disclosure, an STT-MRAM structure where a 1T-1MTJ is a unit cell may be expanded. Thus, the write operation may be performed for each bit of the synapse weight, and the synapse weight may be read out with a one-time read operation.

A second embodiment of the present disclosure will be described below. In the second embodiment that uses a SOT-MRAM structure, as is the case with the STT-MRAM, the write operation is performed on the basis of each bit of the synapse weight using. Thus, the synapse operation is read out with a one-time read operation.

Figure 6:
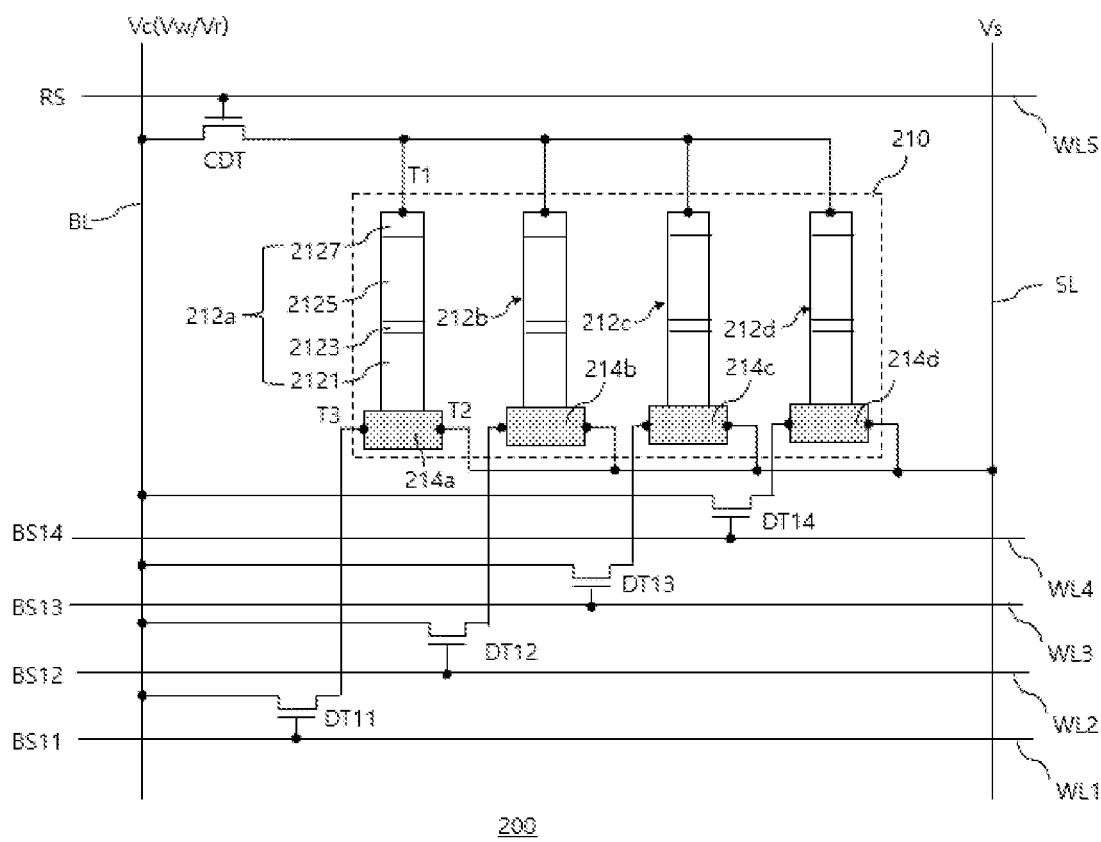
FIG. 6 is a diagram illustrating a neuromorphic device according to a second embodiment of the present disclosure.

FIG. 6 is a diagram illustrating a neuromorphic device 200 according to the second embodiment of the present disclosure.

With reference to FIG. 6, the neuromorphic device 200 according to the second embodiment of the present disclosure may include the bit line BL, the first to fifth word lines WL1 to WL5, the source line SL, a synapse weight element 210, first to fourth drive transistors DT11 to DT14, and a common drive transistor CDT. In this case, the bit line BL may be arranged in a manner that intersects each of the first to fifth word lines WL1 to WL5, and the source line SL may be arranged in parallel with the bit line BL.

The synapse weighting element 210 may store data on the basis of each bit of a synapse weight. The synapse weight element 210 may first to four unit weighting elements 212a to 212d and first to fourth electrode layers 214a to 214d. The first to four unit weighting elements 212a to 212d are magnetic tunnel junction structures (MTJ), respectively, and correspond to bits, respectively, of the synapse weight.

Each of the first to four unit weighting elements 212a to 212d includes first to third electrode terminals T1 to T3. The first electrode terminal T1 is connected to the bit line BL through the common drive transistor CDT in a manner that shares the bit line BL, and the second electrode terminal T2 is connected to the source line SL in a manner that shares the source line SL. The third electrode terminal T3 is connected to the bit line BL through each of the first to fourth drive transistors DT11 to DT14.

The first to four unit weighting elements 212a to 212d are arranged on the tops, respectively, of the first to fourth electrode layers 214a to 214d. Each of the first to four unit weighting elements 212a to 212d includes a free layer 2121, a tunnel barrier layer 2123, a fixed layer 2125, and the capping layer 2127. The free layer 2121 here is in parallel with or in anti-parallel with a magnetization direction of the fixed layer 2125. The free layer 2121 may contain a ferromagnetic material, for example, any one material selected from the group consisting of Fe, Co, Ni, B, Si, Zr, Pt, Tb, Pd, Cu, W, Ta, and Mn.

The tunnel barrier layer 2123 is arranged on the top of the free layer 2121 and may serve as a tunnel barrier. The tunnel barrier layer 2123 may contain a non-magnetic material, for example, at least one material selected from the group consisting of MgO, MgAlO, MgTiO, $Al_2O_3$, $HfO_2$, $TiO_2$, $Y_2O_3$, and $Yb_2O_3$.

The fixed layer 2125 is arranged on the top of the tunnel barrier layer 2123, and magnetization thereof is directed toward a predetermined fixed direction. The fixed layer 2125 may contain a ferromagnetic material, for example, any one material selected from the group consisting of Fe, Co, Ni, B, Si, Zr, Pt, Tb, Pd, Cu, W, and Ta.

The capping layer 2127 is arranged on the top of the fixed layer 2125 and may serve to prevent the fixed layer 2125 from being oxidized. The capping layer 2127 may be formed as an oxide film. The capping layer 2127 here may contain a metal material. For example, the capping layer 2127 may contain Ta, Ru, W, Mo, Co, Fe, Ni, TiN, CoFe, FeNi, CoNi, CoFeB, CoFeBMo, CoFeBW, or the like.

As is the case with the first embodiment of the present disclosure, the first to four unit weighting elements 212a to 212d according to the second embodiment of the present disclosure have different resistance values. A resistance ratio between the first to forth unit weighting elements 212a to 212d may be set to $2^n$ times. For example, a resistance ratio among the respective resistance values of the first to fourth unit weighting elements 212a to 212d may be set to $1(=2^0)$: $2(=2^1)$:$4(=2^2)$:$8(=2^3)$.

A first terminal of each of the first to fourth electrode layers 214a to 214d is connected to the second electrode terminal T2, and a second terminal thereof is connected to the third electrode terminal T3. With the write current Iw flowing between the second electrode terminal T2 and the third electrode terminal T3, each of the first to fourth electrode layers 214a to 214d may generate spin-polarized current for controlling a magnetization direction of the corresponding free layer 2121. With spin-polarized current flowing within each of the first to fourth electrode layers 214a to 214d, spin-orbit torque (SOT) may be applied to the corresponding free layer 2121, and the magnetization direction of the free layer 2121 may change.

The first drive transistor DT11 may be connected between the second electrode terminal T2 of the first unit weighting element 212a and the bit line BL. The second drive transistor DT12 may be connected between the second electrode terminal T2 of the second unit weighting element 212b and the bit line BL. The third drive transistor DT13 may be connected between the second electrode terminal T2 of the third unit weighting element 212c and the bit line BL. The fourth drive transistor DT14 may be connected between the second electrode terminal T2 of the fourth unit weighting element 212d and the bit line BL. Gate terminals of the first to fourth drive transistors DT11 to DT14 may be connected to the first to fourth word lines WL1 to WL4, respectively. The first to fourth drive transistors DT11 to DT14 may be formed as NMOS transistors, respectively, and may be selectively turned on according to first to fourth bit selection signals BS11 to BS14.

The common drive transistor CDT may be connected between each the first electrode terminal T1 of each of the first to four unit weighting elements 212a to 212d and the bit line BL. A gate terminal of the common drive transistor CDT may be connected to a fifth word line WL5. The common drive transistor CDT here may be formed as a NMOS transistor and may be turned on according to a read drive signal RS.

Figure 7:
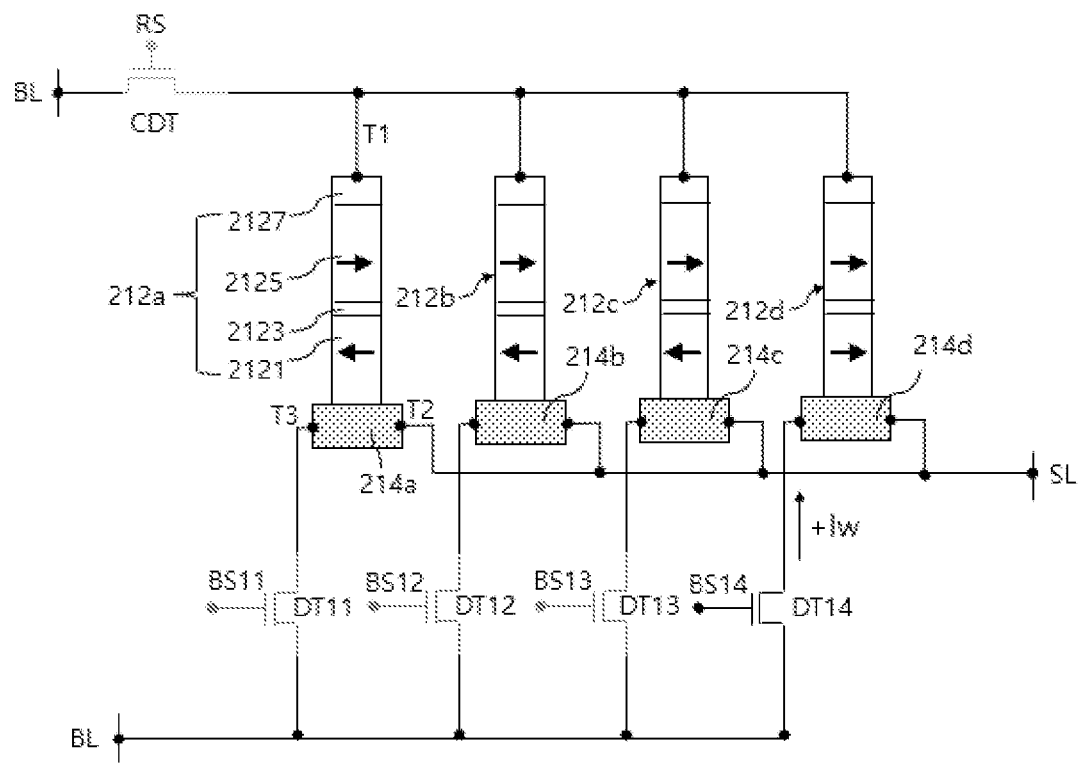
FIG. 7 is a diagram illustrating write operation of each of the first to fourth unit weighting elements illustrated in FIG. 6.

FIG. 7 is a diagram illustrating write operation of each of the first to fourth unit weighting elements 212a to 212d illustrated in FIG. 6.

With reference to FIG. 7, the first to fourth selection signals BS11 to BS14 at a high level that correspond to bits selected during the write operation are applied, and thus the first to fourth drive transistors DT11 to DT14, respectively, are correspondingly turned on. At this point, the common drive transistor CDT is kept turned off.

Then, when the write control voltage Vw is applied to the bit line BL, through the corresponding drive transistor, the write current Iw corresponding to the write control voltage Vw flows between the second electrode terminal T2 and the third electrode terminal T3 of the corresponding unit weighting element, among the first to four unit weighting elements 212a to 212d.

For example, the fourth drive transistor DT14 is turned on, the write current Iw flows between the second electrode terminal T2 and the third electrode terminal T3 of the fourth electrode layer 214d. At this point, the free layer 2121 of the fourth unit weighting element 212d may switch to a state of being in parallel (P) with or in anti-parallel (AP) with the magnetization direction of the fixed layer 2125 along the direction of the write current Iw.

That is, in a state where the magnetization directions of the free layers 2121 of the first to four unit weighting elements 212a to 212d are all in anti-parallel with the magnetization direction of the fixed layer 2125, when the positive (+) write current +Iw in a direction from the second electrode terminal T2 to the third electrode terminal T3, the spin-orbit torque occurs in a positive (+) Z-axis direction within the fourth electrode layer 214d. Furthermore, due to the spin-orbit torque, the free layer 2121 of the fourth unit weighting element 212d is magnetically inverted in parallel with the magnetization direction of the fixed layer 1125 (indicated by arrows). Therefore, the synapse weight may be stored as "0001".

In this manner, the first to four unit weighting elements 212a to 212d may be selected through the first to fourth drive transistors DT11 to DT14, respectively, and thus the synapse weight may be stored. Therefore, the synapse weight may be stored in such a manner as to have one of 16 levels ranging from "0000" to "1111".

Figure 8:
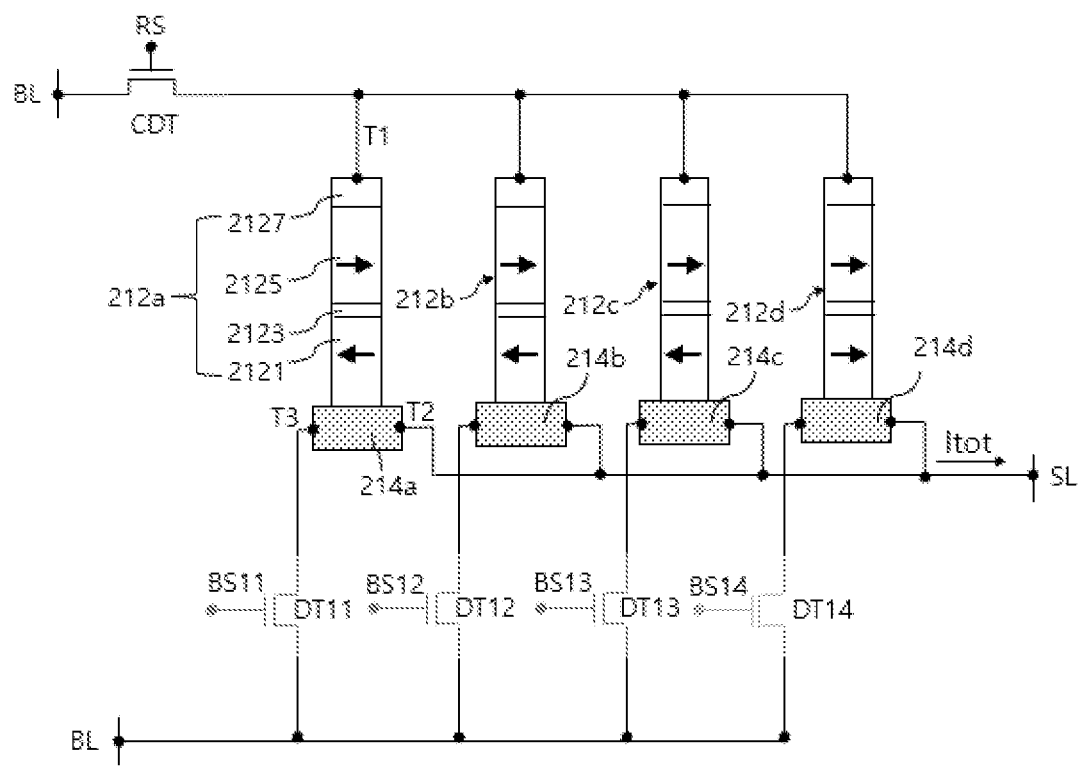
FIG. 8 is a diagram illustrating read operation of each of the first to fourth unit weighting elements illustrated in FIG. 6.

FIG. 8 is a diagram illustrating read operation of each of the first to fourth unit weighting elements illustrated in FIG. 6.

With reference to FIG. 8, during the read operation, when the read drive signal RS at a high level is applied, the common drive transistor CDT is turned on. At this point, the first to four drive transistors DT11 to DT14 are kept turned off. Accordingly, the first to four unit weighting elements 212a to 212d are in parallel connected to each other between the bit line BL and the source line SL.

At this point, when the read control voltage Vr is applied to the bit line BL, current corresponding to the read control voltage Vr flows through each of the first to four unit weighting elements 212a to 212d. In the second embodiment of the present disclosure, the read control voltage Vr is applied to the first to four unit weighting elements 212a to 212d, using one common drive transistor CDT. Therefore, unlike in the first embodiment of the present disclosure, the read control voltage Vr having the same magnitude is applied to opposite terminals of each of the first to four unit weighting elements 212a to 212d. Therefore, as is the case where the first embodiment of the present disclosure, there is no need for separate control or a design change for applying the read control voltage Vr having the same magnitude.

The total of amounts of current flowing through each of the first to four unit weighting elements 212a to 212d is expressed as in Equation 5. The synapse weight may be read out with the total of amounts of current flowing through each of the first to four unit weighting elements 212a to 212d.

That is, the neuromorphic device 200 according to the second embodiment of the present disclosure can the synapse weight in terms of $2^n$ levels ranging from 0 to $2n^{-1}$, and the synapse weight stored in the first to fourth unit weighting elements 212a to 212d can be read out simultaneously. Thus, the read operation can be performed at a high speed.

Although the specific embodiment of the present disclosure has been described for illustrative purposes, those skilled in the art will appreciate that various modifications, additions and substitutions are possible, without departing from the scope and spirit of the disclosure as disclosed in the accompanying claims.

What is claimed is:

1. A neuromorphic device comprising:
a plurality of unit weighting elements connected to a bit line in a manner that shares the bit line, each of the plurality of unit weighting elements being connected to a source line and comprising a fixed layer of which a magnetization direction is fixed, a free layer of which a magnetization direction changes in parallel with or in anti-parallel with the fixed layer, and a tunnel barrier layer arranged between the fixed layer and the free layer; and
a plurality of drive transistors being selectively turned on according to a plurality of bit selection signals, respectively, and correspondingly driving the unit weighting elements, respectively,
wherein the plurality of unit weighting elements have different resistance values in such a manner as to correspond to bits, respectively, of a synapse weight,
wherein a resistance value of any one of the plurality of unit weighting elements is two times or half of a resistance value of other one of the plurality of unit weighting elements.

2. The neuromorphic device of claim 1, wherein each of the plurality of unit weighting elements comprises a cross-section area, wherein each cross-section area varies with the resistance value of each of the plurality of unit weight elements.

3. The neuromorphic device of claim 1, wherein the tunnel barrier layer of each of the plurality of unit weighting elements varies in thickness with the resistance value.

4. The neuromorphic device of claim 1, wherein, among the plurality of unit weighting elements, the unit weighting element having the lowest resistance value corresponds to the most significant bit of the synapse weight, and the unit weighting element having the highest resistance value corresponds to the most insignificant bit of the synapse weight.

5. The neuromorphic device of claim 1, wherein, each of the plurality of drive transistors is connected between each of the plurality of unit weighting elements and the source line, and gate terminals of the plurality of drive transistors are connected to a plurality of word lines, respectively.

6. The neuromorphic device of claim 5, wherein in a state where among the plurality of drive transistors, the corresponding drive transistor is turned on according to the bit selection signal, the magnetization direction of the free layer of each of the plurality of unit weighting elements is controlled with write current flowing through between the bit line and the source line, and thus the synapse weight is stored.

7. The neuromorphic device of claim 5, wherein in a state where the plurality of drive transistors are turned on and where a write control voltage having the same magnitude is applied between the free layer and the fixed layer, the synapse weight is read out with a total of amounts of current flowing between the free layer and the fixed layer of each of the plurality of unit weighting elements.

8. The neuromorphic device of claim 1, wherein the each of the plurality of unit weighting elements further includes:
   an electrode layer through which spin-orbit torque is applied to the free layer, and
   wherein a first terminal of the electrode layer is connected to the bit line, and a second terminal thereof is connected to the source line.

9. The neuromorphic device of claim 8, wherein each of the plurality of drive transistors is connected between the bit line and the first terminal of the electrode layer, and gate terminals of the plurality of drive transistors are connected to a plurality of word lines, respectively.

10. The neuromorphic device of claim 9, wherein in a state where among the plurality of drive transistors, the corresponding drive transistor is turned on according to the bit selection signal, the magnetization direction of the free layer of each of the plurality of unit weighting elements is controlled with write current flowing through between the bit line and the source line, and thus the synapse weight is stored.

11. The neuromorphic device of claim 9, further comprising:
   a common drive transistor connected between the bit line and each of the plurality of unit weighting elements in a shared manner, and selectively turned on according to a read drive signal.

12. The neuromorphic device of claim 11, wherein in a state where the common drive transistor is turned on, the synapse weight is read out with a total of amounts of current flowing between the free layer and the fixed layer of each of the plurality of unit weighting elements.

* * * * *

UNITED STATES PATENT AND TRADEMARK OFFICE
CERTIFICATE OF CORRECTION

| | | |
|---|---|---|
| PATENT NO. | : 11,984,146 B2 | Page 1 of 1 |
| APPLICATION NO. | : 17/721747 | |
| DATED | : May 14, 2024 | |
| INVENTOR(S) | : Seung Heon Baek | |

It is certified that error appears in the above-identified patent and that said Letters Patent is hereby corrected as shown below:

On the Title Page

Below "Item (63)" insert -- (30) Foreign Application Priority Data Nov. 17, 2021 (KR) ............... 10-2021-0158200 --.

Signed and Sealed this
Twenty-second Day of April, 2025

Coke Morgan Stewart
*Acting Director of the United States Patent and Trademark Office*